United States Patent [19]

Hashinaga et al.

[11] Patent Number: 5,327,075
[45] Date of Patent: Jul. 5, 1994

[54] BURN-IN APPARATUS AND METHOD FOR SEMICONDUCTOR DEVICES

[75] Inventors: Tatsuya Hashinaga; Masanori Nishiguchi, both of Yokohama, Japan

[73] Assignee: Sumitomo Electric Industries, Ltd., Osaka, Japan

[21] Appl. No.: 914,559

[22] Filed: Jul. 17, 1992

[30] Foreign Application Priority Data

| | | | |
|---|---|---|---|
| Jul. 19, 1991 | [JP] | Japan | 3-179774 |
| Jul. 29, 1991 | [JP] | Japan | 3-189019 |
| Jul. 31, 1991 | [JP] | Japan | 3-192307 |
| Jul. 31, 1991 | [JP] | Japan | 3-192310 |
| Jul. 31, 1991 | [JP] | Japan | 3-192312 |

[51] Int. Cl.⁵ ............................... G01R 31/02
[52] U.S. Cl. ................ 324/158.1; 165/80.3
[58] Field of Search ........... 324/73.1, 158 R; 361/385; 165/80.4, 80.3, 104.33; 437/8; 219/209, 210

[56] References Cited

U.S. PATENT DOCUMENTS

| | | | |
|---|---|---|---|
| 4,145,620 | 3/1979 | Dice | 361/415 |
| 5,047,711 | 9/1991 | Smith et al. | 324/158 P |

FOREIGN PATENT DOCUMENTS

| | | |
|---|---|---|
| 0283778 | 9/1988 | European Pat. Off. |
| 8701813 | 3/1987 | World Int. Prop. O. |

OTHER PUBLICATIONS

Yu; "Self Heating Test Chip for Reliabilty Life Test"; IBM Technical Disclosure Bulletin; vol. 25, No. 7B; Dec. 1982; p. 3651.

*Primary Examiner*—Vinh Nguyen
*Attorney, Agent, or Firm*—Cushman, Darby & Cushman

[57] ABSTRACT

A burn-in apparatus used in burn-in tests includes a burn-in test chamber for accommodating a plurality of semiconductor devices to be tested. Also, the burn-in apparatus includes measuring devices for detecting electric characteristics of temperature sensors built in the respective semiconductor devices to individually measure junction temperatures of the semiconductor chips incorporated in the respective semiconductor devices, and laser beam irradiating mechanisms or electric heating members. The laser irradiating mechanisms or the heating members are controlled by control units, based on outputs of the measuring devices. Thus, the junction temperatures are maintained in a set junction temperature range, and the screening accuracy can be improved.

20 Claims, 16 Drawing Sheets

BURN-IN APPARATUS AND METHOD FOR SEMICONDUCTOR DEVICES

BACKGROUND OF THE INVENTION

1. Field of the Invention

This invention relates to a burn-in apparatus and method which is used in burn-in tests (high temperature operating tests) in which temperature loads and electric loads are applied to semiconductor devices to be tested.

2. Related Background Art

Burn-in tests are essential to the life estimation of semiconductor devices, and to the detection of infant mortality or early lifetime failures in screening processes. Generally, a burn-in test is conducted using burn-in boards 10 of FIG. 1 and a burn-in test chamber 12 of FIG. 2. Each burn-in board 10 includes a board 14 of a heat resistant resin or the like. This board 14 has a plurality of sockets 16 provided thereon for receiving DUTs (devices under test) or semiconductor devices (not shown), and external terminals 18 provided on one end of the board 14 for the electrical contact to the outside. The board 14 has a handle 20 provided on the opposite end for the manipulation of the burn-in board 10 by an operator. The terminals (not shown) of the sockets 16 are connected to the external terminals 18 by wirings 22 (partially shown in FIG. 1) on the board 14.

Such burn-in boards 10 are set in the burn-in test chamber 12 as shown in FIG. 2, More specifically, the burn-in test chamber 12 comprises a box body 24 as a main body, a lid 26 attached to the box 24 by a hinge mechanism 28, and a board connector 30 provided in the box body 24. The board connector 30 has slits 32 for receiving the boards 14 of the burn-in board 10. When the boards 14 are inserted into the slits 32 of the board connector 30, the external terminals 18 of the burn-in boards 10 and the terminals (not shown) of the board connector 30 are connected. Through this connection, an electric power is supplied to the semiconductor devices by a power supply means (not shown). Although not shown, the burn-in test chamber 12 includes a temperature adjusting means. The temperature adjusting means is generally in the form of a means for supplying heated air into the interior of the burn-in test chamber 12, or in the form of a heating means.

An interior temperature of the burn-in test chamber 12, i.e., an environmental temperature $T_a$ of the atmosphere surrounding the semiconductor devices is measured by a temperature sensor (not shown) disposed near the inner surface of the wall of the box 24. The conventional burn-in test have been conducted by controlling the temperature adjusting means while monitoring measured temperatures (MIL-STD 883). But for the following reasons, such conventional art is insufficient to properly conduct the burn-in tests.

In the conventional art, what can be monitored real time is an environmental temperature $T_a$ of semiconductor devices, and this environmental temperature $T_a$ does not agree with a surface temperature of the semiconductor chips constituting the semiconductor devices, especially with junction temperatures $T_j$ at the pn junctions or Schottky junctions of the semiconductor chips. Since failures of semiconductor devices depend on these junction temperatures $T_j$, for the efficient estimation of lives of semiconductor devices and the efficient detection of early lifetime failures of semiconductor devices without applying overloads to proper devices, it is preferable to conduct burn-in tests within a set junction temperature $T_j$ range. In the conventional burn-in tests, a junction temperature $T_j$ is estimated based on a measured environmental temperature $T_a$, and burn-in tests is conducted based on the estimated junction temperature. But it needs very complicated operations to check relationships between an environmental temperature $T_a$ and a junction temperature $T_j$, and different estimating operations are needed in accordance with different sizes types and specifications of semiconductor devices to be tested. Accordingly it has been difficult to conduct simple burn-in tests with high precision. Additionally, the environmental temperature $T_a$ varies depending on locations in the burn-in test chamber 12, and heat generation amounts of respective semiconductor devices to be tested are not the same either. Therefore, it has not been easy to screen a number of semiconductor devices under uniform conditions.

SUMMARY OF THE INVENTION

An object of this invention is to provide a burn-in apparatus and method which can selectively control junction temperatures of the respective semiconductor chips of a plurality of semiconductor devices which are burn-in tested at the same time.

To achieve this object, the burn-in apparatus according to this invention comprises: at least one burn-in board for mounting a plurality of semiconductor devices incorporating semiconductor chips; a burn-in test chamber accommodating the burn-in board(s); measuring means for individually detecting electric characteristics of temperature sensors built in the respective semiconductor chips to individually measuring junction temperatures of the respective semiconductor chips; heating means for selectively heating the respective semiconductor devices; and control means for selectively controlling the heating means based on outputs of the measuring means so that junction temperatures of the respective semiconductor chips are in a set temperature range.

It is preferable that the heating means is a laser beam irradiating means for selectively irradiating a laser beam to the semiconductor devices. When the control device finds one of the semiconductor devices which has a junction temperature lower than a set temperature range, the laser beam irradiating means irradiates a laser beam to the semiconductor device and can increase the junction temperature of the semiconductor chip of the device to the set temperature range.

It is possible that the reflected beams of laser beams against the respective semiconductor devices are detected to adjust irradiating directions of the laser beams from the laser beam irradiating means.

The heating means may be heating members positioned near the respective semiconductor devices which are electrically heated. Electric power supplied to the respective heating members are separately controlled to control junction temperatures of the semiconductor chips.

This invention also provides a burn-in method comprising: the step of positioning at least one burn-in board with a plularity of semiconductor devices in a burn-in test chamber, the semiconductor devices incorporating semiconductor chips with temperature sensors built in; the step of individually detecting electric characteristics of the temperature sensors and individually measuring junction temperatures of the respective semiconductor chips; and the step of selectively heating the semiconductor devices so that measured junction temperatures of the semiconductor chips are within a set temperature range.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art form this detailed description.

BRIEF DESCRIPTION OF THE DRAWINGS

In the course of the following detailed description, reference will be made to the attached drawings in which.

BRIEF DESCRIPTION OF THE PREFERRED EMBODIMENTS

Figure 1:
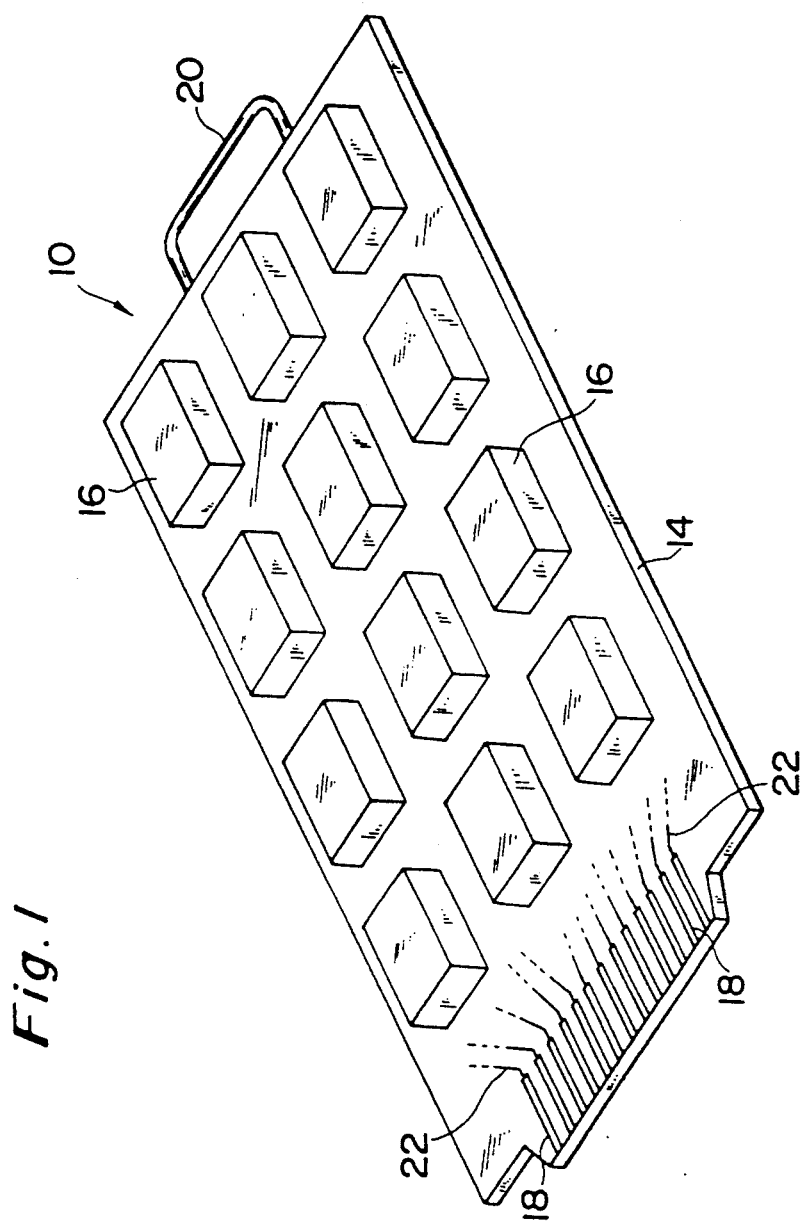
FIG. 1 is a perspective view of the typical burn-in board used in burn-in tests.

In the following description, like reference numerals designate like or corresponding parts throughout the several views.

Figure 2:
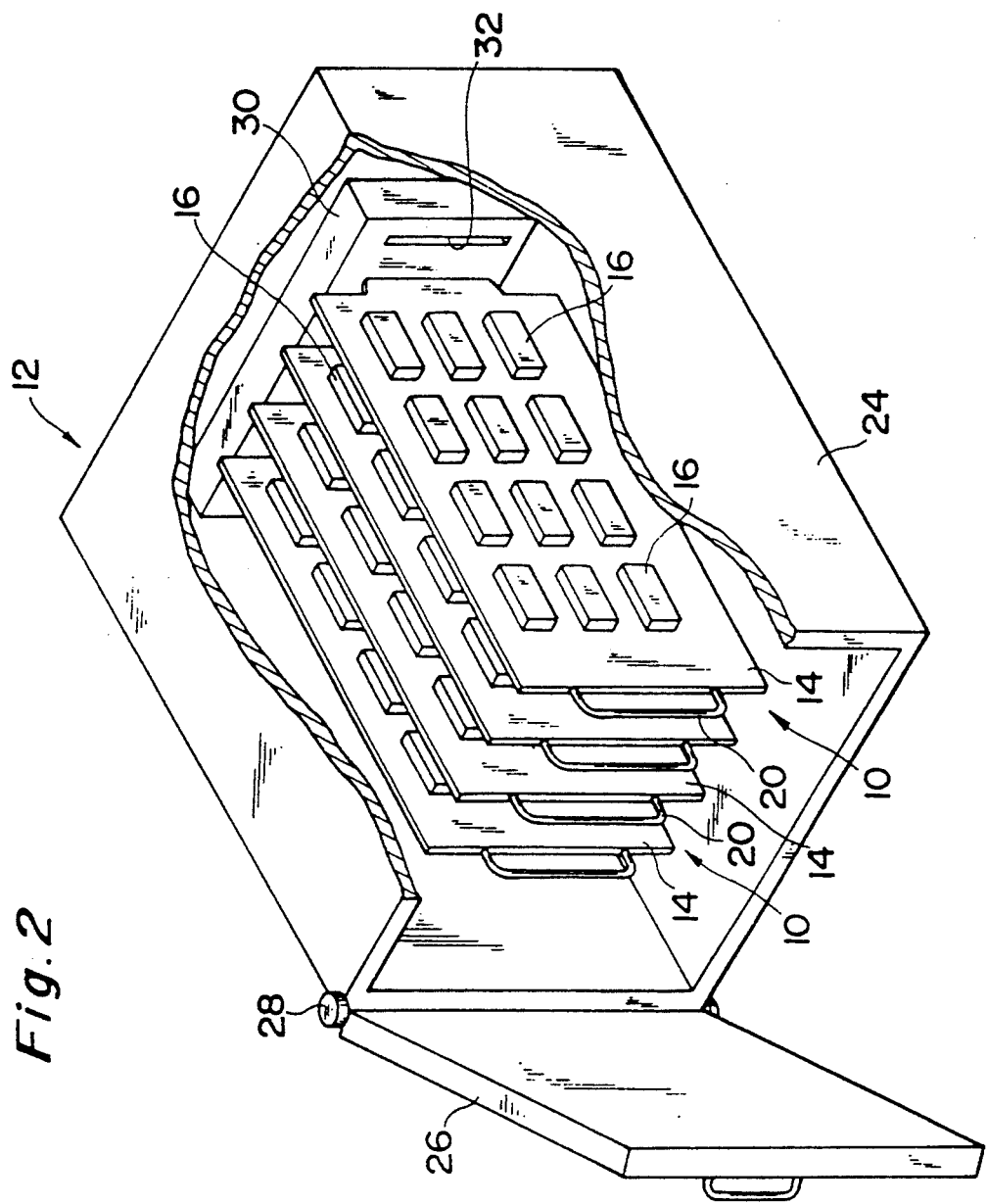
FIG. 2 is a partially broken perspective view of a burn-in test chamber with a plurality of the burn-in boards disposed therein.
Figure 3:
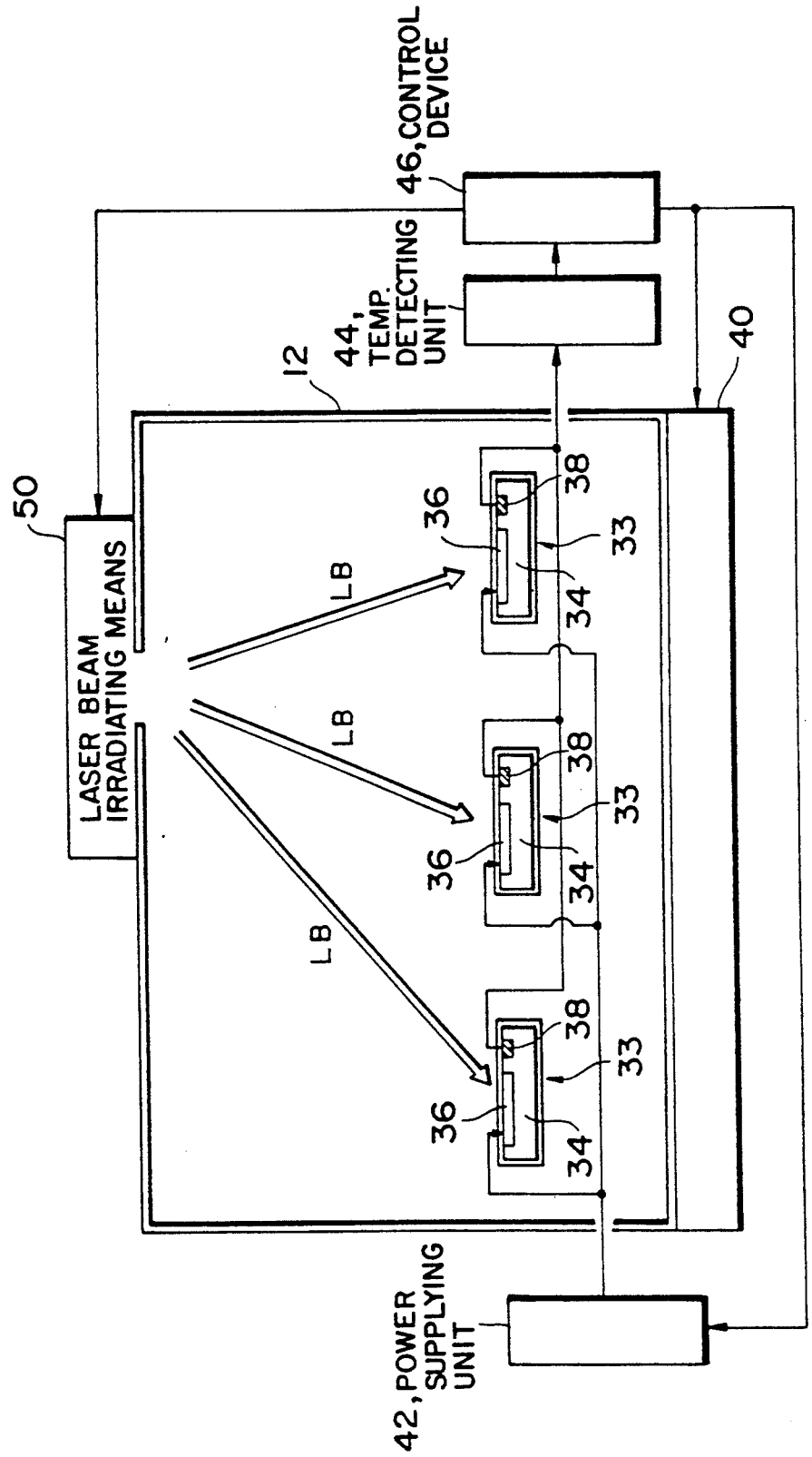
FIG. 3 is a schematic view of the burn-in apparatus according to a first embodiment of this invention.

FIG. 3 shows a schematic view of the burn-in apparatus according to a first embodiment of this invention. The burn-in apparatus according to the first embodiment comprises the same burn-in test chamber 12 including a box body and a lid as the above-described conventional burn-in test chamber (see FIG. 2). This burn-in test chamber 12 accommodates a plurality of burn-in boards (not shown), and semiconductor devices 33 to be tested are mounted on each burn-in board by sockets (not shown). Each semiconductor device 33 has a semiconductor chip 34 incorporated therein. An integrated circuit 36 and a temperature detection diode 38 as a temperature sensor 38 are formed on the semiconductor chip 34. In the burn-in test chamber 12, there is provided a temperature adjusting unit 40 for adjusting an environmental temperature in the burn-in test chamber 12 by blowing heated air, or heating by a heater. In the burn-in test chamber 12, there is provided a laser beam irradiating means 50 as heating means for heating the semiconductor devices 33. Laser beams LB are selectively irradiated to the semiconductor devices 33.

The integrated circuits 36 of the respective semiconductor chips 34 are supplied with an electric load from a power supplying unit 42. Electric characteristics (especially changes of a threshold voltage (a forward voltage) $V_F$) of the respective temperature detection diodes 38 are individually monitored to measure junction temperatures $T_j$ of the respective semiconductor chips 34. This temperature measurement is conducted in the following way.

In measuring electric characteristics of the temperature detection diode 38, a junction temperature of the temperature detection diode 38 is measured. The heat resistance of the semiconductor chip 34 is sufficiently smaller than heat resistances of its ambient substances (air, or molding materials), and the following relationships are given.

(A junction temperature of the temperature detection diode 38) ≈

(A junction temperature of the integrated circuit 36) = $T_j$

Hereinafter both junction temperatures are represented commonly by $T_j$.

Figure 4:
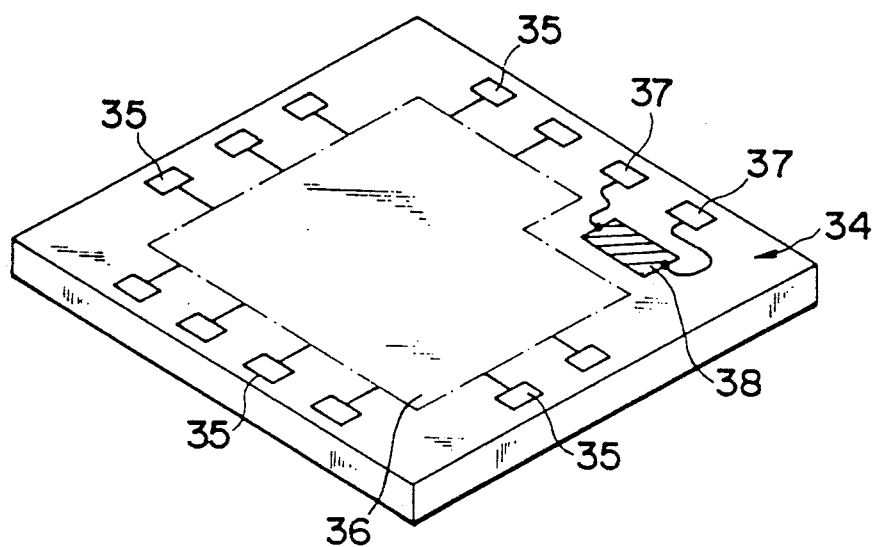
FIG. 4 is a perspective view of a semiconductor ship of a semiconductor device to be tested.
Figure 5:
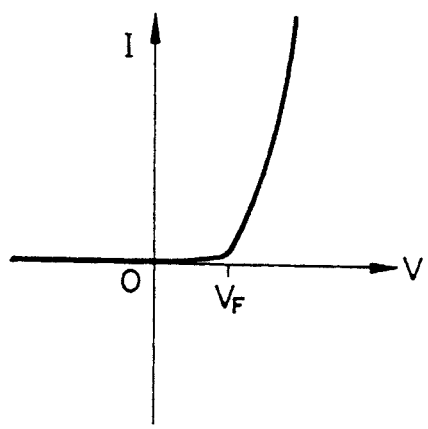
FIG. 5 is a graph of an I-V characteristic of a temperature detection diode in the semiconductor chip at a temperature.

FIG. 4 shows a perspective view of the semiconductor chip 34 involved in the above-described embodiment. FIG. 5 is a graph of an I-V characteristic of the temperature detection diode 38 at a temperature. As shown in FIG. 4, on the semiconductor chip 34, there are formed the integrated circuit 36, the temperature detection diode 38, a power supply pad 35 connected to the integrated circuit 36 and monitoring pads 37 connected to the anode and the cathode of the temperature detection diode 38. This semiconductor chip 34 is packaged in a flat package or a leadless chip-carrier (LCC) as a semiconductor device 33 to be burn-in tested. The temperature monitoring for this semiconductor chip 34 is based on the observation of an I-V characteristic of the temperature detection diode 38. That is, the forward voltage $V_F$ of the I-V characteristic of FIG. 5 changes substantially linearly with respect to junction temperatures in a range of junction temperatures exhibited in a burn-in test of the semiconductor device. This relationship is approximately expressed by the following Formula 1.

$$V_F \approx TC \cdot T_j + V_{F0} \tag{1}$$

$V_F$: Forward voltage of a temperature detection diode

TC: Temperature coefficient of $V_F$ value $T_j$: Junction temperature of a semiconductor device or chip to be tested $V_{F0}$: Constant given for each semiconductor device or chip to be tested.

A current flowing through the temperature detection diode 38 when a forward voltage $V_F$ is applied thereto is so trivial that the temperature detection diode does not contribute much to increase of a junction temperature. When the forward voltage $V_F$ is measured with the integrated circuit 36 unfed, a junction temperature $T_j$ agrees with an environmental temperature.

Figure 6:
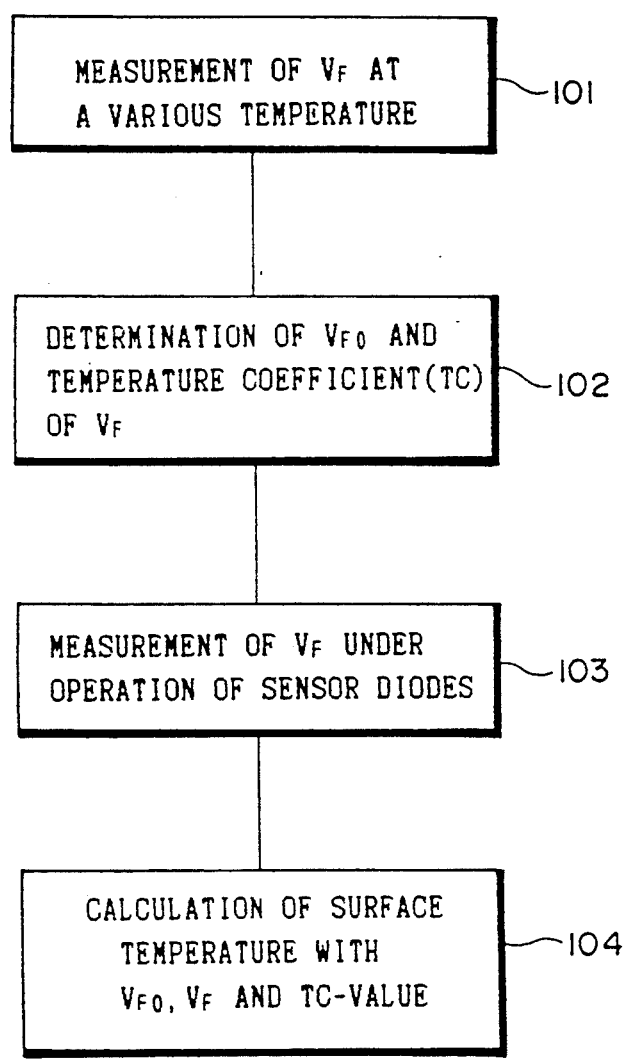
FIG. 6 is a flow chart of a first measuring method of junction temperatures.

A first temperature measurement technique uses the above-described property, and the flow chart of this technique is shown in FIG. 6. First, values of a forward voltage $V_F$ are measured at different environmental temperatures with the integrated circuit 36 unfed (Step 101). Based on the measured values of the forward voltage and Formula 1, a value of a constant $V_{F0}$ of the forward voltages $V_F$, and a value of a temperature coefficient TC of the forward voltages $V_F$ are given (Step 102). Following this preparation, a burn-in test is started, and during the burn-in test, temperatures of the semiconductor chips 34 are accurately detected. That is, semiconductor chips 34 are mounted on the burn-in apparatus, and while the integrated circuits 36 are in operation with a current supplied to, values of the forward voltages $V_F$ are measured (Step 103). Values of the junction temperatures $T_j$ are given based on the value of the constant $V_{F0}$, the value of the temperature coefficient TC, and measured values of forward voltages $V_F$ (Step 104).

Also the following second junction temperature measurement technique can give measured values of precision as high as the first technique.

Figure 7:
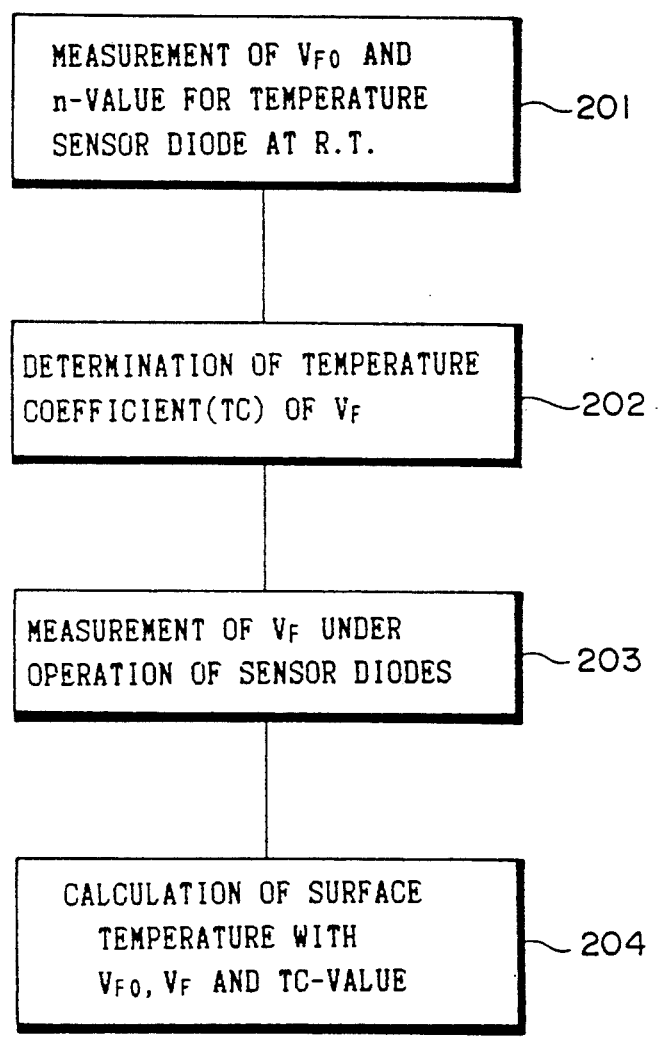
FIG. 7 is a flow chart of a second measuring method of junction temperatures.

FIG. 7 shows the flow chart of the second junction temperature measurement technique. First, a value of a constant $V_{F0}$ of a temperature detection diode 38 formed on the semiconductor chip 34, and an ideal value n thereof are given at the room temperature (Step 201). Here, a forward current $I_F$ of the Schottky type temperature detection diode 38 is given by the following Formula 2.

$$I_F \approx SA^*T^2 \exp\left(-\frac{q\phi_B}{kT}\right)\exp\left(\frac{qV_F}{nkT}\right) \quad (2)$$

S: Schottky junction area

A*: Effective Richardson constant

T: Absolute temperature k: Boltzmann constant q: Electron charge $\phi_B$: Barrier height n: Ideal factor.

A forward voltage $V_F$ of the temperature detection diode 38 and an ideal factor n thereof can be given based on an I-V characteristic of the temperature detection diode 38. A temperature coefficient TC of the temperature detection diode 38 is given by the following Formula 3.

$$TC \equiv \frac{\partial V_F}{\partial T} = \frac{nk}{q}\left(2 - \ln\frac{I_F}{SA^*T^2}\right) \quad (3)$$

Figure 17:
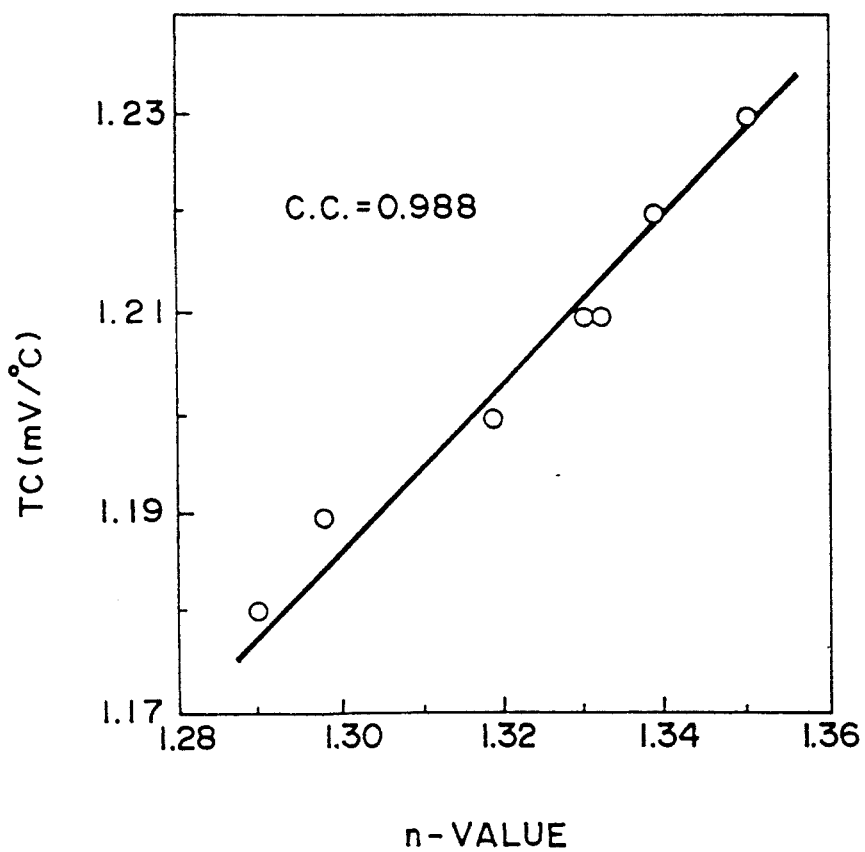
FIG. 17 is a graph of an experimental result of a relationship between TC value and n value

Variations of a value of the second term in the parentheses of Formula 3 are sufficiently small in the junction temperature range of burn-in tests, so that the TC value is almostly proportional to the n value. This elation between TC and n was confirmed by an experimental result shown in FIG. 17.

A temperature coefficient TC of the forward voltage $V_F$ is given by Formula 1 and 2 (Step 202) to detect an accurate temperature of the semiconductor chip 34 during a burn-in. That is, semiconductor chips 34 are mounted on the burn-in apparatus, and while the integrated circuits 36 are in operation with a current supplied to, values of the forward voltages $V_F$ are measured (Step 203). Then, based on the value of the constant $V_{F0}$ given at the room temperature, the values of the threshold voltages $V_F$ given real time during a burn-in, and a value of the ideal factor n, junction temperatures $T_j$ of the temperature detection diodes 38, i.e., surface temperatures of the semiconductor chips 34, are given real time (Step 204).

FIG. 3 is again referred to. The burn-in apparatus according to this invention includes control device 46. The control device 46 controls electric power supplying unit 42 and temperature adjusting unit 40, based on monitor results of the temperature detecting unit 44, and also the laser beam irradiating means 50. To this end, the control device 46 stores an allowable temperature range of junction temperatures for a burn-in test, and is programmed to compare monitor results with this stored allowable temperature range and suitably control the temperature adjusting unit 40 and the laser beam irradiating means 50.

The method for controlling the laser beam irradiating means 50 will be explained in more detail. When the control device 46 finds a semiconductor device 33 whose junction temperature $T_j$ is lower than a stored allowable temperature range, based on monitor results of the temperature detecting unit 44, the control device 46 causes a laser beam LB to be selectively irradiated to the semiconductor device 33, whereby the junction temperatures $T_j$ are unified. Specifically, when a semiconductor device 33 has a low junction temperature $T_j$ outside a stored allowable temperature range, a laser beam LB is irradiated to the semiconductor device, and when the junction temperature $T_j$ has reached the allowable range, the irradiation is stopped. Thus, accurate screening, and accurate screening is enabled.

Figure 8:
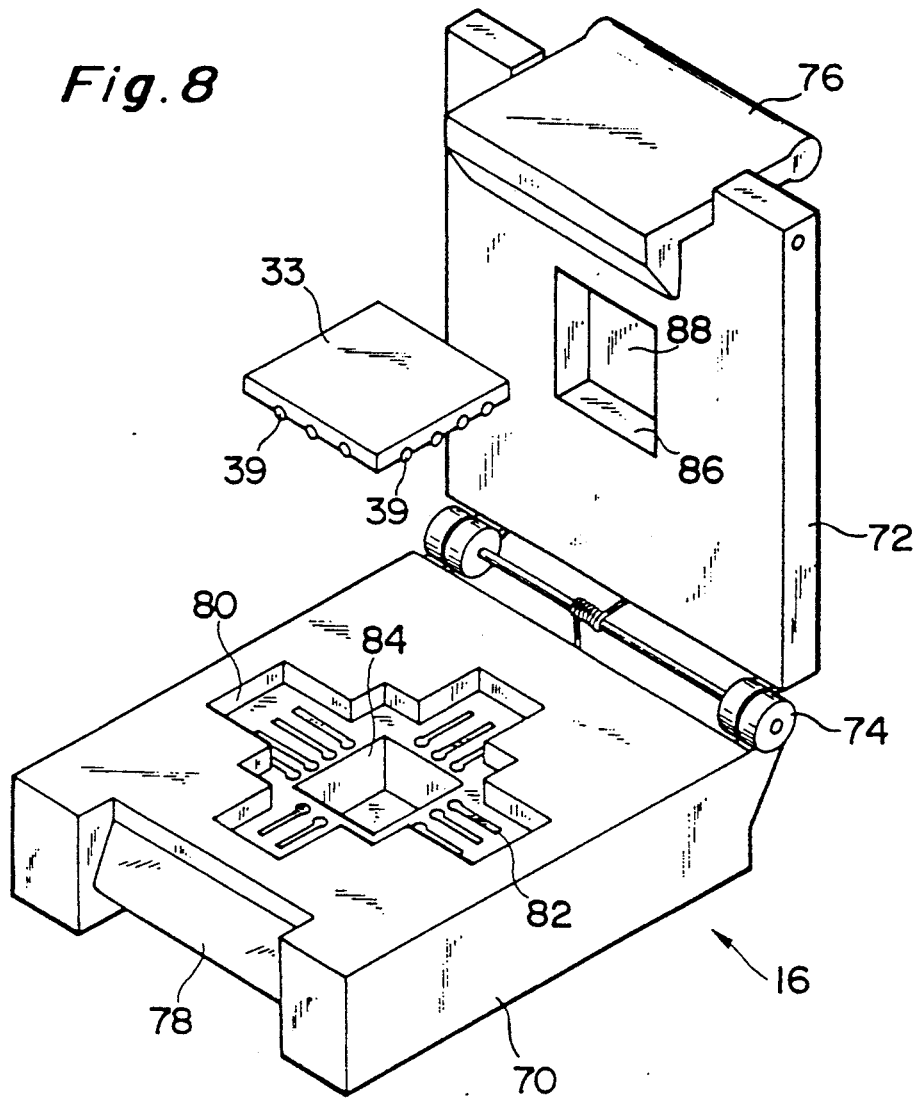
FIG. 8 is a perspective view of a socket for receiving a semiconductor device, the socket enabling the irradiation of laser beams to a semiconductor device in the socket.
Figure 9:
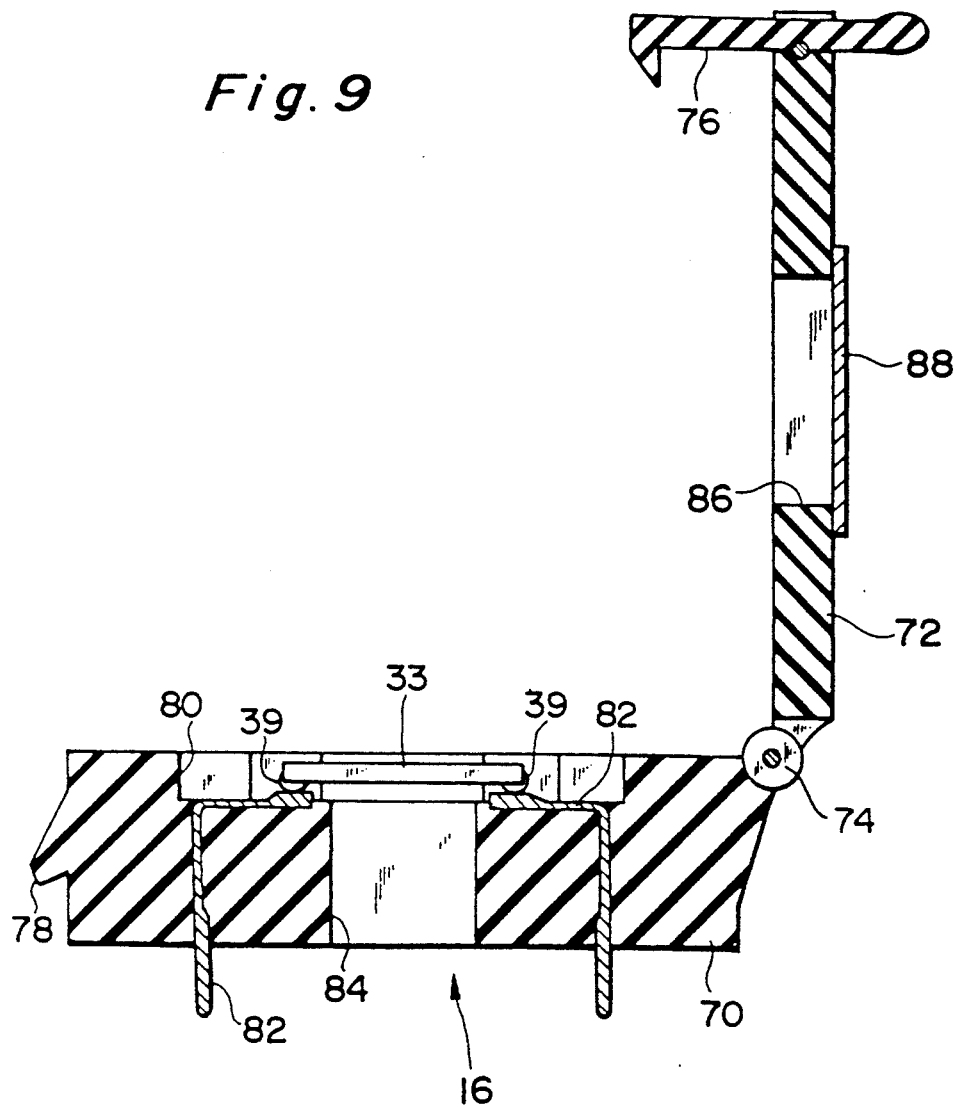
FIG. 9 is a sectional view of the socket of FIG. 8.

Although any suitable socket for setting the semiconductor device 33 on the burn-in board 10 can be used, it is necessary that a laser beam LB is irradiated on a portion, preferably on the upper surface of the semiconductor device 33. FIGS. 8 and 9 show a preferred example of a socket 16 for set the semiconductor device 33 on the burn-in board 10. Each socket 16 fixed on the burn-in board 10 comprises a base 70 and a lid 72 connected to the base 70 openably by a hinge 74. When a lever 76 attached to the lid 72 is locked with a hook 78 formed on the base 70, the base 70 is closed by the lid 72. In the central portion of the base 70, there is formed a cross-shaped concavity 80. A plurality of terminals 82 are provided on the bottoms of the arm portions of the concavity 80. One ends of the respective terminals 82 are projected from the underside of the base 70 to be connected to the wirings (not shown) on the burn-in board 10. A through-hole 84 is formed in the central portion of the cross-shaped concavity 80. An opening 86 is formed through the central portion of the lid 72, and a laser beam transmitting glass 88 through which laser beams can pass is provided in the opening 86.

The semiconductor device 33 has a plurality of terminals 39 provided on the underside thereof. These terminals 39 are brought into contact with corresponding terminals 82 of the socket 16 when the semiconductor device 33 is mounted in the socket 16. When the semiconductor device 33 is placed in a concavity 80 and the lid 72 is closed, the boundary portion of the opening 86 on the inside of the lid 72 is pressed against the boundary portion of the top surface of the semiconductor device 33, whereby the semiconductor device 33 is secured in the socket 16. The opening 86 through the lid 72, which is opposed to the central portion of the top surface of the semiconductor device 33, permits a laser beam to be incident on the top surface of the semiconductor device 33 through the laser beam transmitting glass 88. It is possible to separately provide a heat conducting member (not shown) for more efficient heat conduction and radiation.

Figure 10:
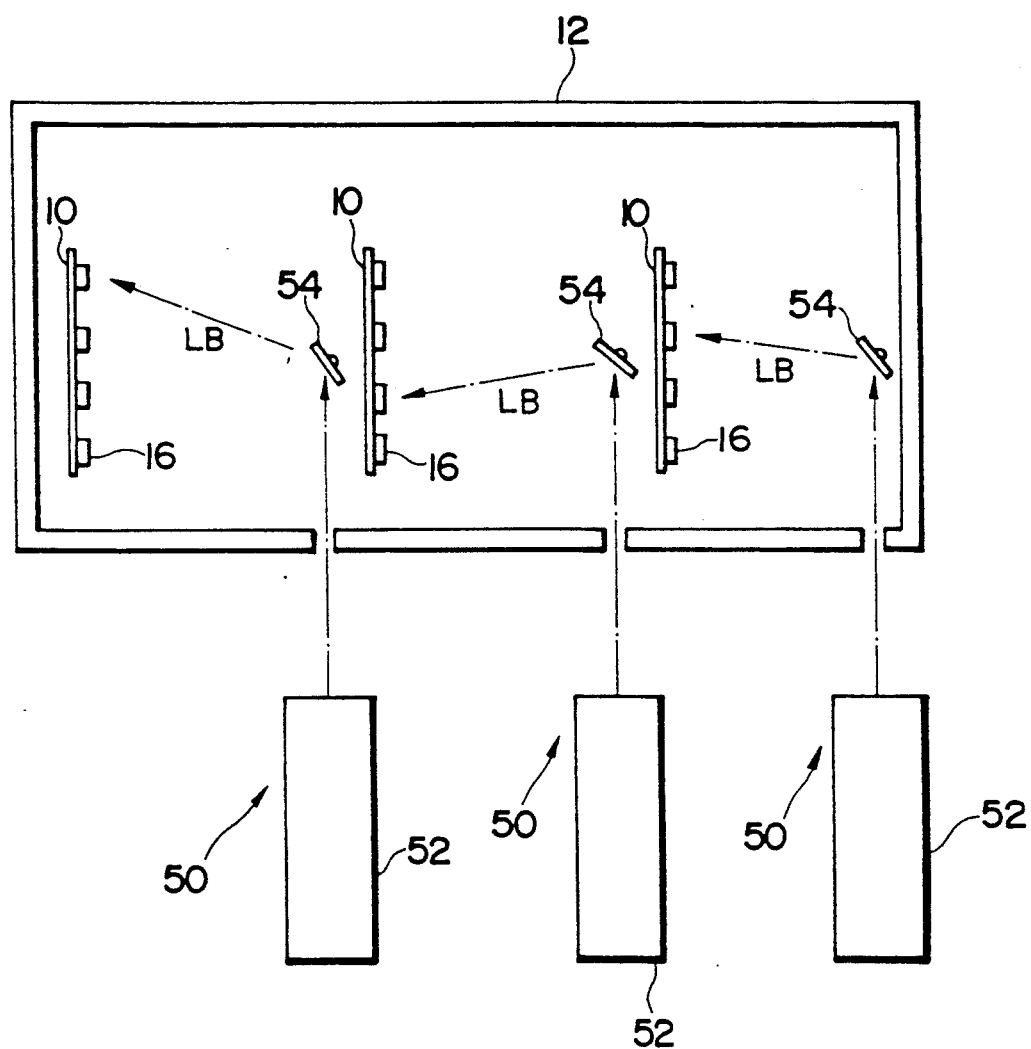
FIG. 10 is a schematic view of one example of a laser beam irradiating means.

FIG. 10 shows one example of the laser beam irradiating means 50. As shown in FIG. 10, three laser beam sources 51 are provided outside the burn-in test chamber 12, when the number of the burn-in boards 10 accommodated in the chamber 12 is three. When laser beams LB are irradiated into the burn-in test chamber 12, the respective beams LB are reflected on their associated reflecting mirrors 54 to be incident on semiconductor devices 33 whose junctions temperatures are lower than a stored allowable temperature range. Although not shown apparently, each reflecting mirror 54 is supported in the burn-in test chamber 12 by means of a joint, e.g., a ball joint, and its angle is variably horizontally and vertically by associated suitable driving means (not shown). The control device 46 controls the driving means to change angles of their associated reflecting mirrors 54, so that laser beams LB from the laser beam sources 52 can be irradiated to required semiconductor devices 33. Consequently, a number of semiconductor devices 33 can have a substantially uniform junction temperature.

Figure 11:
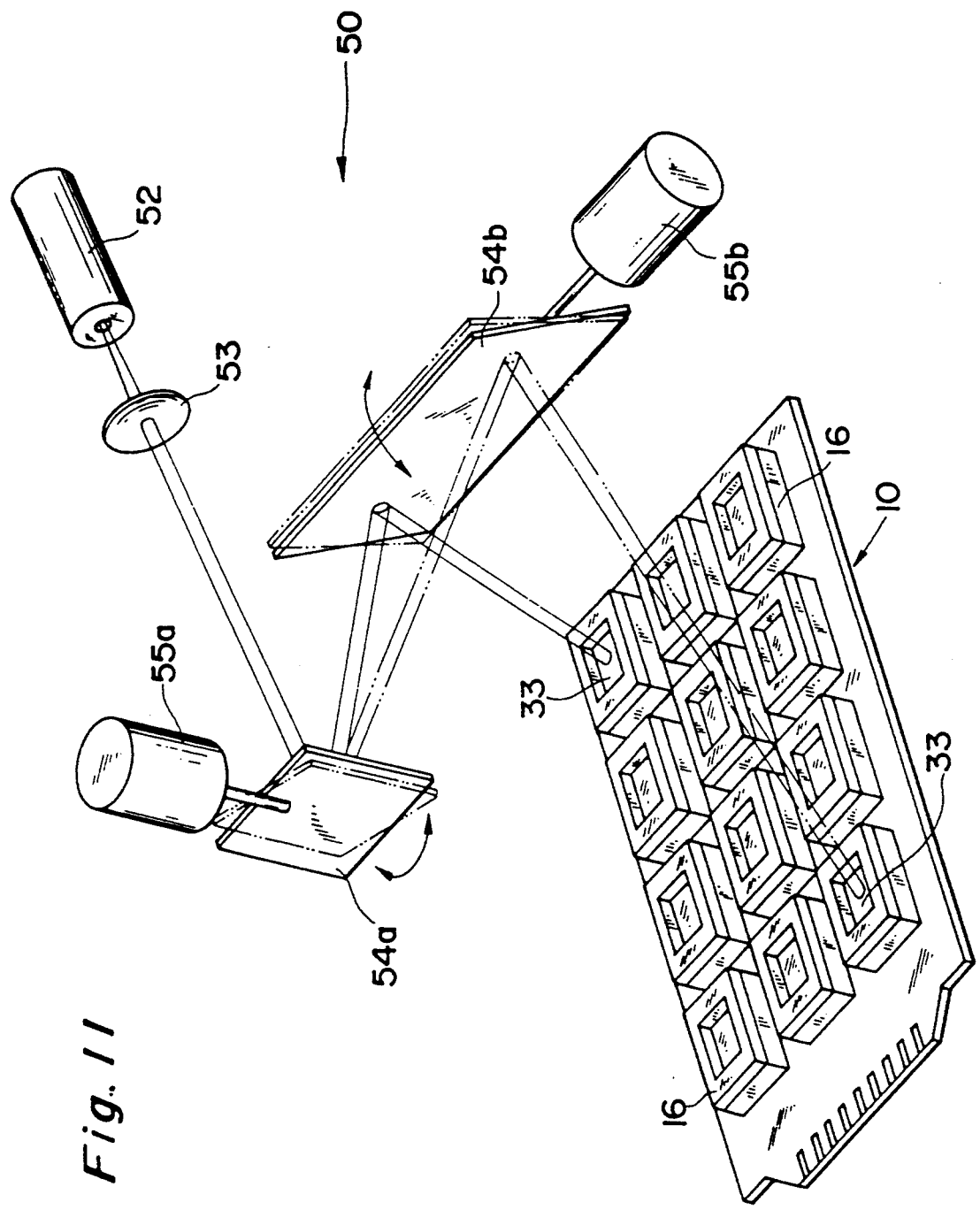
FIG. 11 is a conceptual view of another example of the laser beam irradiating means.

FIG. 11 shows another example of the laser beam irradiating means 50. The laser beam irradiating means 50 according to this example comprises a laser beam source 52, two reflecting mirrors 54a, 54b for turning a path of a laser beam emitted from a laser beam source 52. The reflecting mirror 54a is rotated on a vertical shaft by driving means 55a, such as a galvanometer, and the reflecting mirror 54b is rotated on a horizontal shaft by driving means 55b, such as a galvanometer. Rotation angles of these reflecting mirrors 54a, 54b are suitably adjusted, whereby a laser beam from the laser beam source 52 can be incident on a required semiconductor device 33. Reference numeral 53 represents a condenser lens.

An incident position of the laser beam LB is determined by a position of a target socket 16, i.e., a position of a target semiconductor device 33. Accordingly, if the burn-in board has different specifications and standards, the above-described laser beam irradiating means 50 will not work. In a case that the semiconductor devices 33 have different locations, it is possible that means 56 for adjusting an optical path or irradiating direction of a laser beam is additionally provided in the burn-in apparatus.

Figure 12:
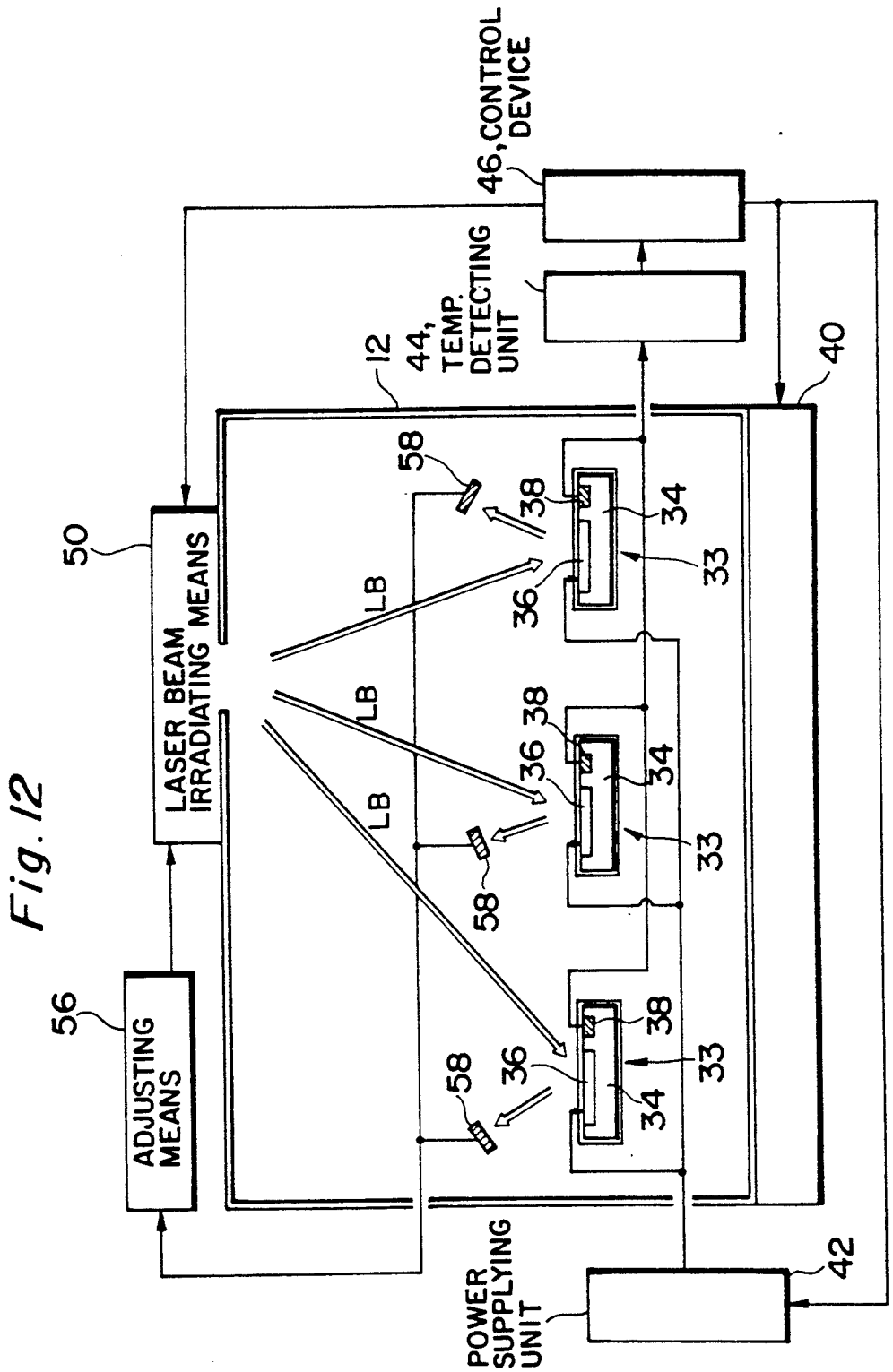
FIG. 12 is a schematic view of the burn-in apparatus according to a second embodiment of this invention.

The means 56 for adjusting an optical path of a laser beam is connected to optical sensors or photosensors 58 provided on the respective semiconductor devices 33. Outputs of the reflected beams of laser beams LB detected by the photosensors 58 are supplied to the adjusting means 56. The photosensors 58 are provided by, e.g., photodiodes. Each photosensor 58 is located on the optical path of a reflected beam of a laser beam LB from the laser beam irradiating means 50 reflected accurately on the top surface of a semiconductor device 33. Based on a detected output of the photosensor 58, it is judged whether an irradiating position is accurate, and an irradiating direction of a laser beam LB from the laser irradiating means 50 is adjusted. Specifically, an angle of the reflecting mirror 54 is adjusted so as to adjust an irradiating direction of a laser beam LB. The burn-in apparatus of FIG. 12 according to a second embodiment of this invention uses the adjusting means 56. The burn-in apparatus according to the second embodiment can easily adjust an irradiating direction of a laser beam LB. Once an irradiating direction of a laser beam LB is adjusted, the laser beam LB can be irradiated accurately on a required semiconductor device 33. It should be note that the outputs of the photosensors 58 must be calibrated, since the photosensors have temperature characteristics.

Figure 13:
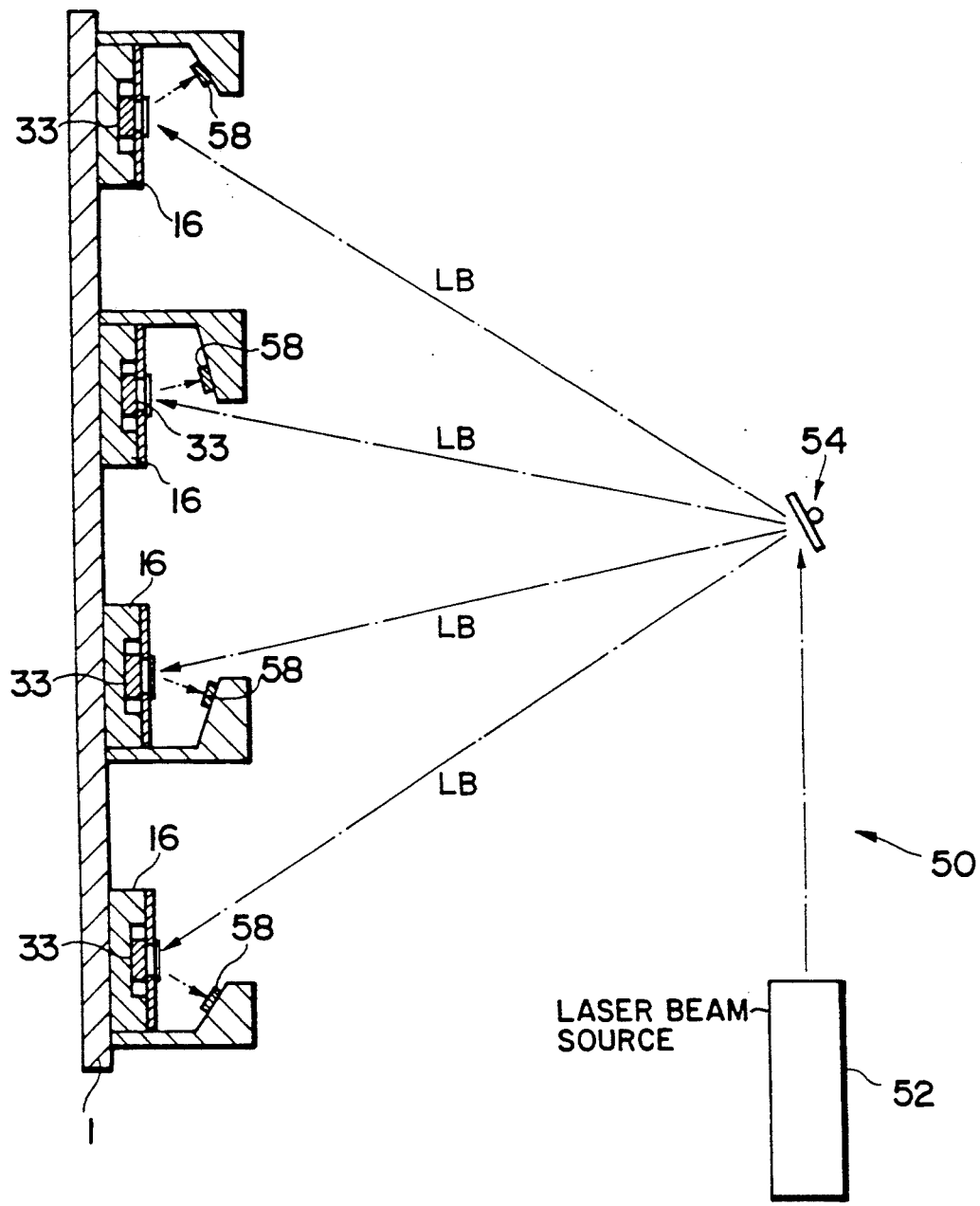
FIG. 13 is a view explaining positional relationships among photosensors, laser beam sources of the laser beam irradiating means, and reflection mirrors used in the embodiment of FIG. 12.

FIG. 13 is a schematic view explaining positional relationships among the photosensors 58, and the laser beam source 52 and the reflecting mirrors 54 of the laser beam irradiating means 50. A sensor support rod 60 is provided on a burn-in board 10 near each socket 16, and a photosensor 58 is mounted on the sensor support rod 60. A laser beam LB from the laser beam source 52 is reflected on the reflecting mirror 54 which is angularly controllable, and irradiated to the semiconductor device 33. If an angle of the reflecting mirror 54 is suitable, a reflected beam on the reflecting mirror 54 is detected by the photosensor 58. In this arrangement, an incident position of a laser beam can be easily adjusted, and accordingly even when burn-in boards having a different socket location, burn-in test of high precision can be conducted.

In the above-described embodiment, a laser beam is irradiated to the semiconductor device through the laser beam transmitting glass 88 of the socket 16. But it is possible that a laser absorptive member is fitted in the opening 86 through the lid 72, and the member is heated to heat the semiconductor device 33. It is possible to give the heat radiation and conduction function to the laser absorptive member.

Figure 14:
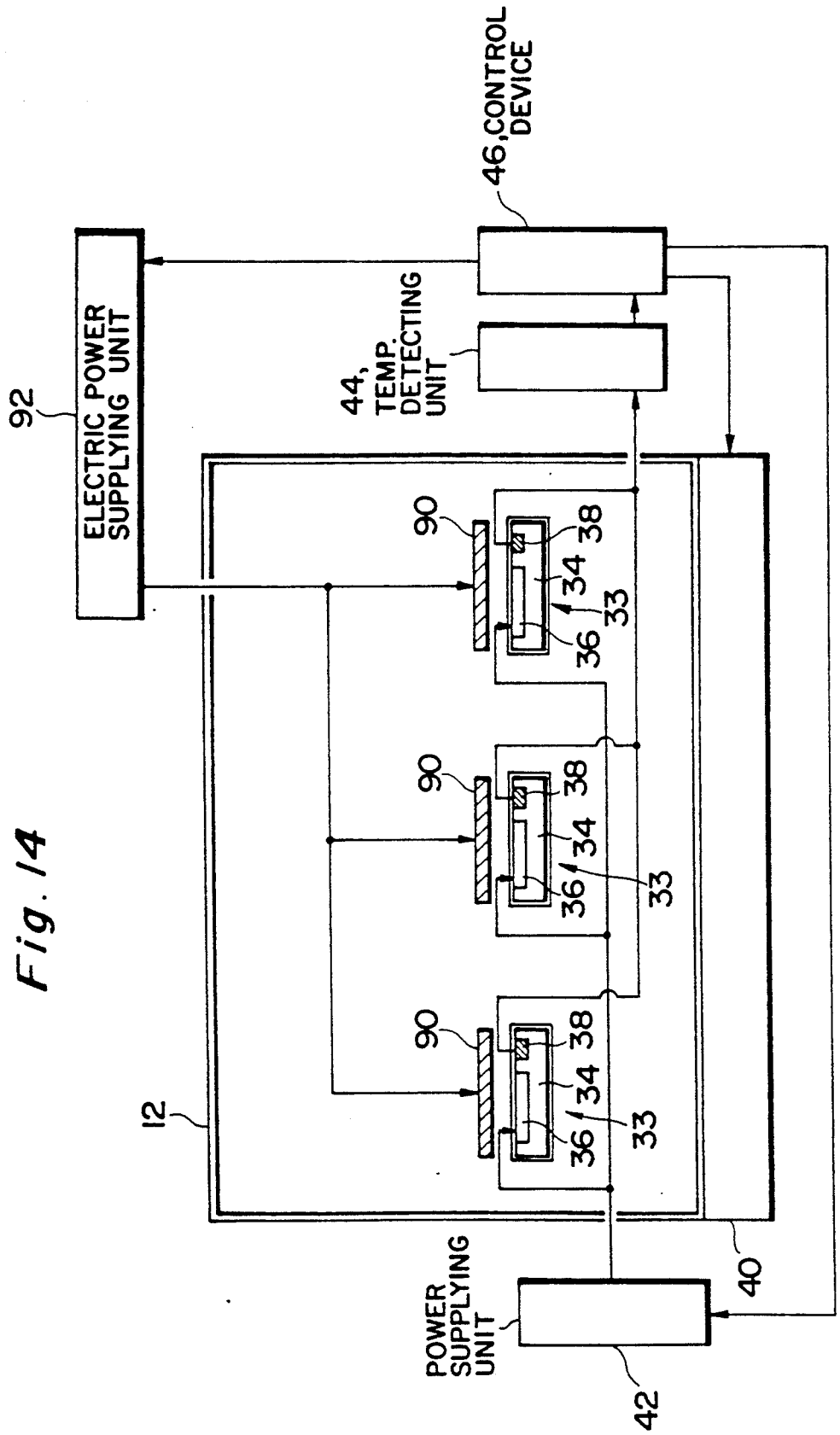
FIG. 14 is a schematic view of the burn-in apparatus according to a third embodiment of this invention.

The means for heating the semiconductor device 33 may be a heating member 90, such as a ceramic heater or a resistor, disposed near each semiconductor device 33 as schematically shown in FIG. 14. An electric power amount supplied to this heating member 90 is controlled through an electric power supplying unit 92, whereby junction temperatures $T_j$ of the semiconductor chips 34 incorporated in the semiconductor devices 33 can be controlled.

Figure 15:
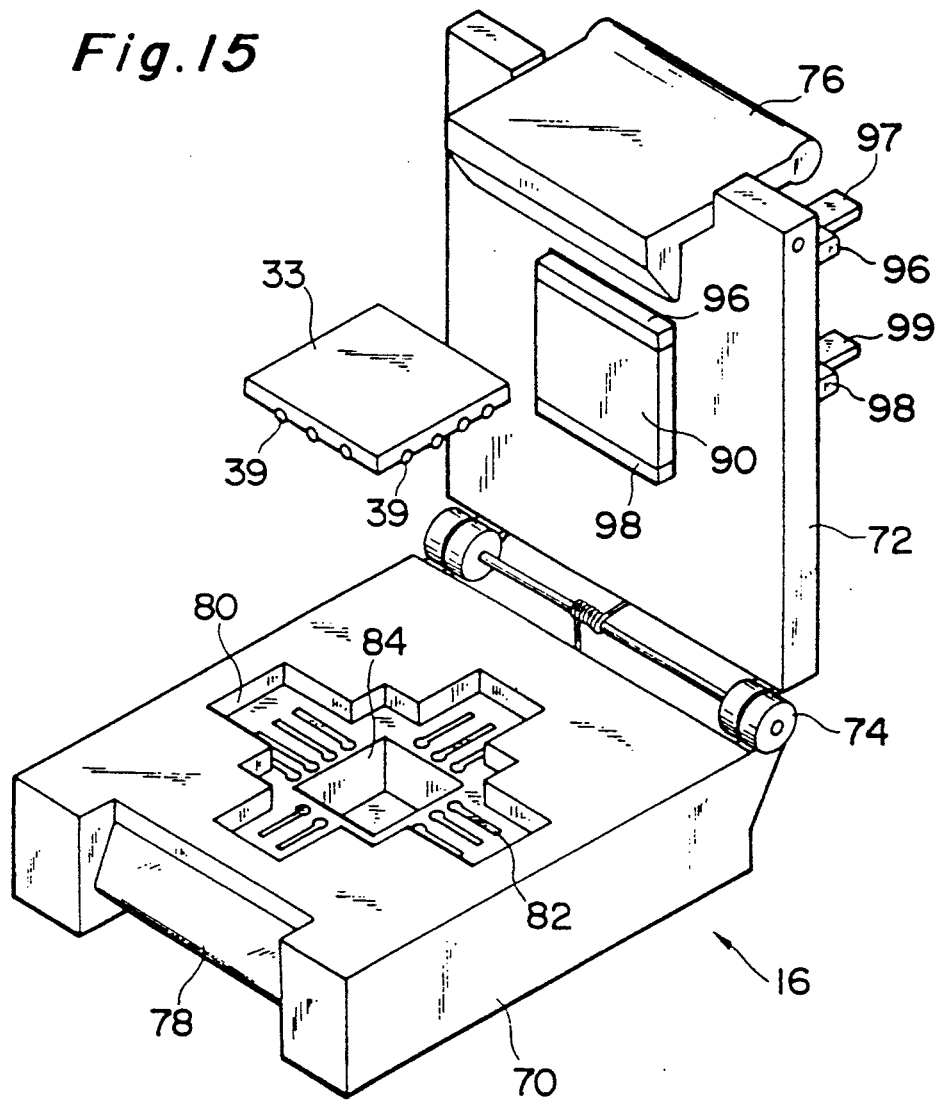
FIG. 15 is a perspective view of a heating member used in the embodiment of FIG. 15 mounted on a socket.
Figure 16:
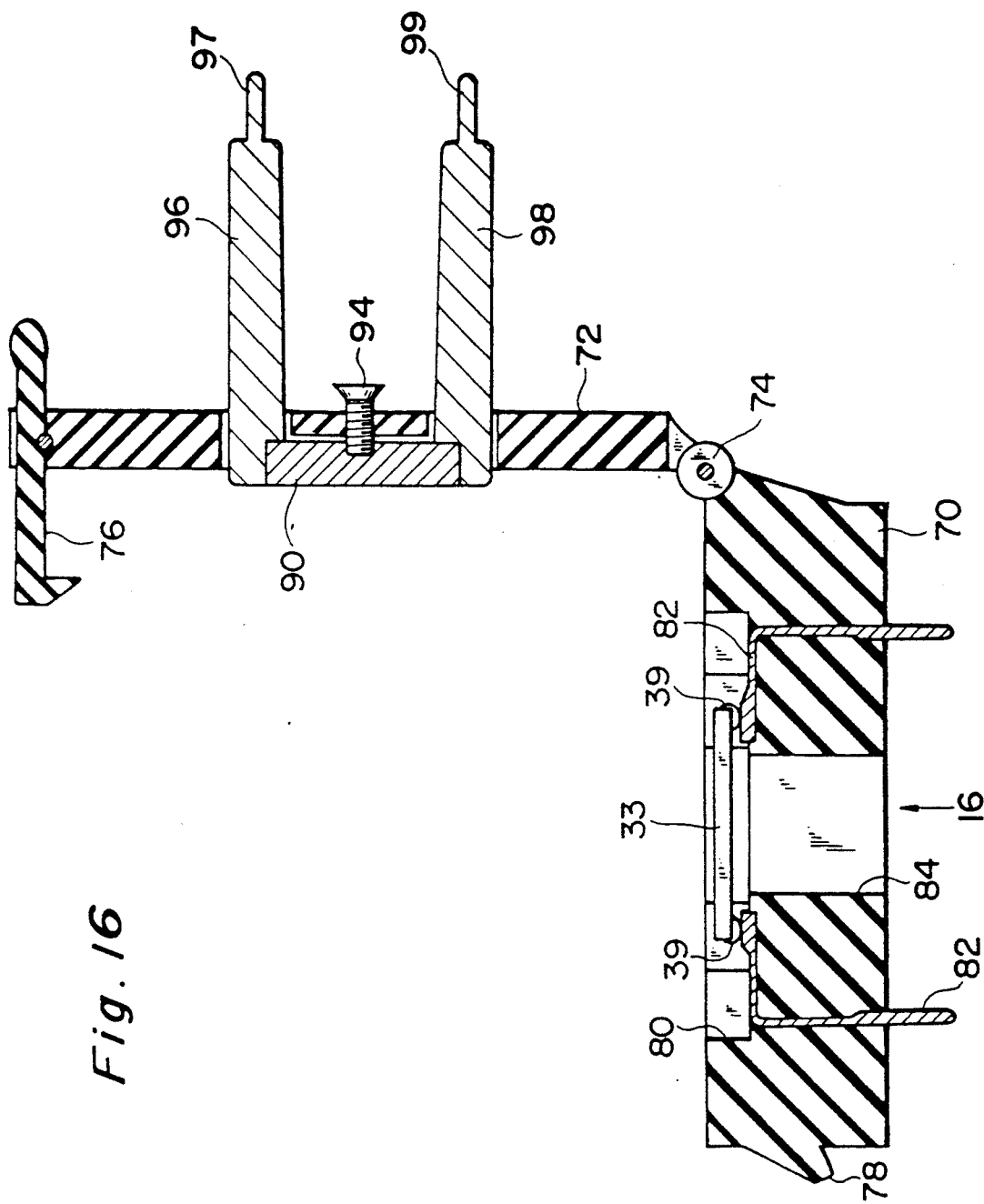
FIG. 16 is a sectional view of the socket of FIG. 15.

It is preferable that a heating member 90 is provided on each socket 16 for receiving a semiconductor device 33. FIGS. 15 and 16 show one example of the structure for mounting the heating member 90. The heating member 90 is secured by a screw 94 to the central portion of the lid 72 of the socket 16. Electrically conducting members 96, 98 are fixed to both sides of the heating member 90 and extended outside through the lid 72. Terminals 97, 99 are formed on the ends of the members 96, 98, and through these terminals 96, 98 the heating member 90 is supplied with an electric power to be heated. When the lid 72 is closed, the bottom surface of the heating member 90 is brought into contact with the top surface of the semiconductor device 33. The heating member 90 is heated to heat the semiconductor device 33. When the electric power feed to the heating member 90 is stopped, the semiconductor device 33 conducts the heat through the heating member 90 and the members 96, 98 and radiates it.

The control device 46 recognizes junction temperatures $T_j$ of the respective semiconductor chips 34, based on monitor results of the temperature detecting unit 44, and controls electric power supplied to the respective heating members 90. Thus, junction temperatures $T_j$ of all the respective semiconductor chips 34 can be controlled uniform with precision. That is, a heat generation amount of the heating members 90 is made different between a semiconductor chip 34 having a lower junction temperature than a stored allowable temperature range and a semiconductor chip 34 having a higher junction temperature than the range, whereby the junction temperatures $T_j$ can be unified. Specifically, a heat generation amount of the heating member 90 for a semiconductor device 33 whose junction temperature $T_j$ is lower than a stored allowable temperature range is raised by increasing an electric power. Then when the control means 46 judges based on monitor results from the temperature detecting unit 44 that the junction temperature $T_j$ has returned to the stored allowable temperature range, the supply to the heating member 90 is stopped. Thus, accurate screening can be achieved.

As described above, the control of the laser beam irradiating means 50 and the heating members 90 can unify the junction temperatures $T_j$. However, it is possible that an electric power amount supplied to the integrated circuits 36 of the semiconductor devices 33 is varied by the control device 46 to control the heating of the semiconductor chips 34 themselves, whereby the unification of the junction temperatures $T_j$ can be assisted. In this case, needless to say, the supplying of electric power to the integrated circuits 36 is conducted within an allowable range of the supply power amount for actual operations.

The temperature sensor used in this invention is not limited to a temperature detection diode formed separate from an integrated circuit on a semiconductor chip, or can be a diode or a transistor incorporated in the integrated circuit. Otherwise, a NiCr or WSi metal film resistor may be formed on the semiconductor chip.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

We claim:

1. A burn-in apparatus comprising:
   at least one burn-in board for mounting a plurality of semiconductor devices having semiconductor chips incorporated therein;
   a burn-in test chamber for accommodating said burn-in boards;
   measuring means for detecting electric characteristics of temperature sensors which are built in the respective semiconductor chips for individually determining junction temperatures of the semiconductor chips, and for generating signals corresponding to said junction temperatures;
   laser beam irradiating means provided in said burn-in test chamber for selectively irradiating a laser beam to the respective semiconductor devices which are mounted on said at least one burn-in board positioned in said burn-in test chamber, where said laser beam is irradiated based on a control signal; and
   control means for generating a control signal for said laser beam irradiating means based on outputs from said measuring means so that said laser beam irradiating means irradiates a laser beam to each semiconductor device which has a junction temperature below a predetermined temperature to maintain junction temperatures of the respective semiconductor devices in said predetermined junction temperature.

2. A burn-in apparatus according to claim 1, wherein said laser beam irradiating means includes a laser beam source, and means for adjusting an optical path of a laser beam emitted from said laser beam source.

3. A burn-in apparatus according to claim 1, comprising adjusting means for detecting a reflected beam of a laser beam reflected on each of the semiconductor devices, and for adjusting an optical path of the laser beam from said laser beam irradiating means.

4. A burn-in apparatus according to claim 3, wherein said adjusting means for adjusting an optical path of a laser beam includes a photosensor disposed near each of the semiconductor devices for detecting said reflected beam of said laser beam.

5. A burn-in apparatus according to claim 1, wherein the semiconductor devices are received respectively in a plurality of sockets mounted on said at least one burn-in board, each socket having an opening for passing a laser beam from said laser beam irradiating means to the semiconductor received therein.

6. A burn-in apparatus according to claim 1, wherein the semiconductor devices are received respectively in a plurality of sockets mounted on said at least one burn-in board, each socket including a member which can be heated by a laser beam from said laser beam irradiating means.

7. A burn-in apparatus according to claim 1, wherein each of said temperature sensors is a Schottky junction diode formed on the semiconductor chips.

8. A burn-in apparatus according to claim 1, wherein each of said temperature sensor is a pn junction diode formed on the semiconductor chips.

9. A burn-in apparatus according to claim 1 wherein each of said temperature sensors is a transistor formed on each of the semiconductor chips.

10. A burn-in apparatus according to claim 1, wherein each of said temperature sensors is a metal film resistor formed on each of the semiconductor chips.

11. A burn-in apparatus according to claim 1, wherein each of said temperature sensors produces an output voltage value based on both a junction temperature of the associated semiconductor device and a level of voltage which is input to said temperature sensors from said measuring means.

12. A burn-in apparatus according to claim 1, comprising means for supplying an electric power to each of the semiconductor chips, and said control means controls said electric power supplying means, based on outputs of said measuring means.

13. A burn-in method comprising the steps of:
   positioning at least one burn-in board having a plurality of semiconductor devices thereon in a burn-in test chamber, said semiconductor devices incorporating semiconductor chips with temperature sensors built in;
   detecting electric characteristics of said respective temperature sensors to individually determine junction temperatures of the semiconductor chips; and
   selectively heating the semiconductor chips by irradiating a laser beam onto the semiconductor chips having a junction temperature below a predetermined junction temperature so that measured values of the junction temperatures of the respective semiconductor chips are maintained in said predetermined junction temperature.

14. A burn-in method according to claim 13, further comprising the steps of detecting a laser beam which is reflected from each semiconductor device, generating a signal corresponding to said reflected laser beam, and adjusting an optical path of the laser beam based on said generated signal.

15. A burn-in method according to claim 13, wherein a junction temperature of each semiconductor chip is derived from the electric characteristic of said temperature sensor associated with the semiconductor chip, based on required parameters.

16. A burn-in method according to claim 15, wherein said temperature sensors are Schottky junction diodes, the parameters for each temperature sensor for deriving a junction temperature thereof is an applied voltage at a specific junction temperature for causing a trifle current of a specific value to flow, and a temperature coefficient of the applied voltage, and the parameters are given by measuring at various environmental temperatures with the semiconductor devices unfed for causing the trifle current of the specific value to flow.

17. A burn-in method according to claim 15, wherein said temperature sensors are Schottky junction diodes, the parameters for each temperature sensor for deriving a junction temperature thereof are an applied voltage at a specific junction temperature for causing a trifle current to flow, and a value of n in the following Formula, and the parameters are given by measuring, with the semiconductor devices unfed, applied voltages at a room temperature for causing trifle currents of various values, and using a relationship expressed by the following Formula $$I_F \approx SA^*T^2 \exp\left(-\frac{q\phi_B}{kT}\right)\exp\left(\frac{qV_F}{nkT}\right)$$

$I_F$: Forward current
$V_F$: Forward voltage
S: Schottky junction area
$A^*$: Effective Richardson constant
T: Absolute temperature
k: Boltzmann constant
q: Electron charge
$\phi_B$: Barrier height.

18. A burn-in method according to claim 15, wherein said temperature sensors are pn junction diodes, and the parameters for each temperature sensor for deriving a junction temperature thereof are an applied voltage at a specific junction temperature for a trifle current of a specific value to flow, and a temperature coefficient of the applied voltage, and the parameters are given by measuring, with the semiconductor devices unfed, applied voltages for causing the trifle current of the specific value to flow at various environmental temperatures.

19. A burn-in method according to claim 15, wherein said temperature sensors are transistors, the parameters for deriving junction temperatures of the respective temperature sensors are an applied voltage at a specific junction temperature for causing a trifle current of a specific value, and a temperature coefficient of the applied voltage, and the parameters are given by measuring, with the semiconductor devices unfed, applied voltages for causing the trifle current of the specific value to flow at various environmental temperatures.

20. A burn-in method according to claim 15, wherein said temperature sensors are a metal film, the parameters for deriving a junction temperature of each temperature sensor are an applied voltage at a specific junction temperature for causing a trifle current of a specific value to flow, and a temperature coefficient of the applied voltage, and the parameters are given by measuring, with the semiconductor devices unfed, applied voltages for causing the trifle current of the specific value to flow at various environmental temperatures.

* * * * *